(12) United States Patent
Rokugawa (10) Patent No.: US 6,434,819 B1
(45) Date of Patent: Aug. 20, 2002

(54) PRODUCTION OF MULTILAYER CIRCUIT BOARD

(75) Inventor: Akio Rokugawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/443,369

(22) Filed: Nov. 19, 1999

(30) Foreign Application Priority Data

Nov. 27, 1998 (JP) ............................................. 10-337682

(51) Int. Cl.⁷ ................................................ A01K 3/10
(52) U.S. Cl. ............................... 29/852; 29/830; 29/846
(58) Field of Search ........................... 29/830, 852, 847; 174/261, 255; 427/98

(56) References Cited

U.S. PATENT DOCUMENTS

| | | | | |
|---|---|---|---|---|
| 5,337,466 A | * | 8/1994 | Ishida | 29/830 |
| 5,517,758 A | * | 5/1996 | Nakamura | |
| 6,119,335 A | * | 9/2000 | Park et al. | 29/830 |
| 6,119,338 A | * | 9/2000 | Wang et al. | 29/830 |
| 6,195,883 B1 | * | 3/2001 | Bhatt et al. | 29/830 |

FOREIGN PATENT DOCUMENTS

JP   A-4-116893   4/1992

* cited by examiner

*Primary Examiner*—Carl J. Arbes
(74) *Attorney, Agent, or Firm*—Pennie & Edmonds LLP (57) ABSTRACT

To enable vias to be arranged at an improved density and ensure good electrical connection between conductor wiring patterns in the adjoining insulating layers, a process of producing a multilayer circuit board having multiple layers of conductor wiring patterns with insulating layers intervening therebetween, the insulating layers having vias extending therethrough to provide electrical connection between the conductor wiring patterns, the process comprising the steps of: providing a circuit board having a conductor wiring pattern formed on one side thereof; forming an insulating layer covering the conductor wiring pattern and said one side of the circuit board; forming a viahole extending through the insulating layer to the conductor wiring pattern, the viahole having a bottom defined by an exposed portion of the conductor wiring pattern; forming a recess in the insulating layer, the recess extending from an orifice of the viahole in the same pattern as another conductor wiring pattern which will be formed on the insulating layer; forming a layer of a plated metal covering the insulating layer and filling the viahole and the recess; and abrasive-working the plated metal layer until the insulating layer is exposed so that portions of the plated metal that fill the viahole and the recess remain unremoved and have top surfaces flush with a top surface of the insulating layer.

17 Claims, 6 Drawing Sheets

PRODUCTION OF MULTILAYER CIRCUIT BOARD

BACKGROUND OF THE INVENTION

1. Field of the Invention

The present invention relates to a process of producing a multilayer circuit board.

2. Description of the Related Art

A multilayer circuit board is conventionally produced by a build-up process as shown in FIGS. 1(a) to 1(e).

Figure 1A:
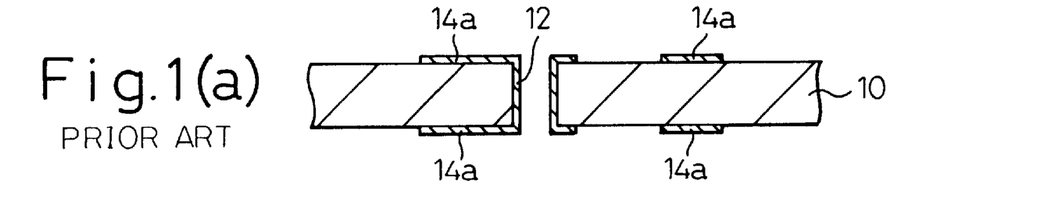
FIGS. 1(a) to 1(e) show a conventional process of producing a multilayer circuit board, in sectional views.

FIG. 1(a) shows a circuit board 10 which serves as a starting material for producing a multilayer circuit board and has conductor wiring patterns 14a on both sides thereof and a throughhole 12 extending therethrough to provide electrical connection between the conductor wiring patterns 14a on both sides.

Figure 1B:
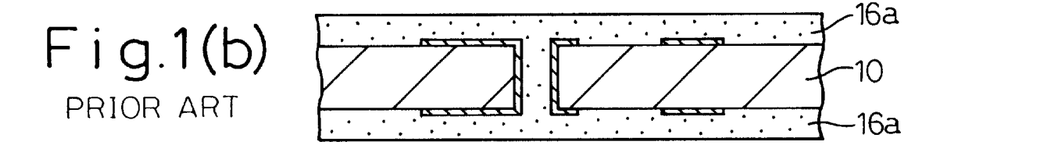

FIG. 1(b) shows a first insulating layer 16a formed by coating a polyimide or other insulating resin on the surface of the circuit board 10.

Figure 1C:
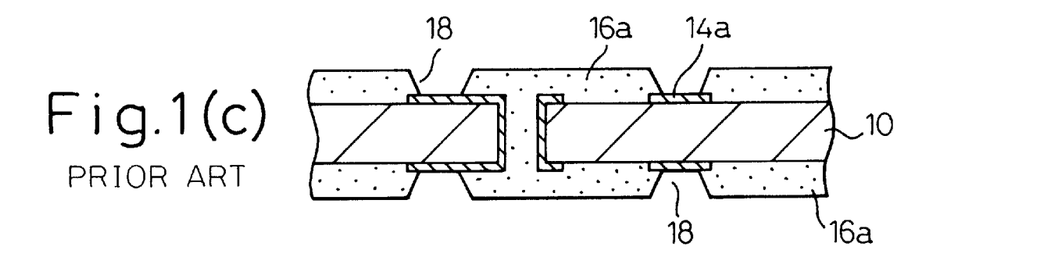

FIG. 1(c) shows a viahole 18 formed through the first insulating layer 16a to enable forming a via which provides electrical connection between the conductor wiring pattern 14a on the surface of the circuit board 10 and another conductor wiring pattern which will be formed on the surface of the first insulating layer 16a. The viahole 18 can be formed by irradiating a laser beam onto the insulating layer 16a.

Figure 1D:
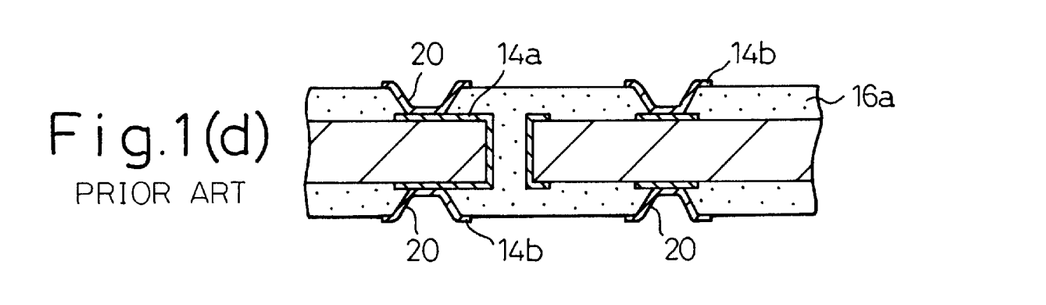

FIG. 1(d) shows a conductor layer defining a conductor wiring pattern 14b formed on the surface of the insulating layer 16a and a via 20 formed on the side wall and the bottom of the viahole 18, the via 20 electrically connecting the conductor wiring pattern 14a on the surface of the circuit board 10 to another conductor wiring pattern 14b on the surface of the insulating layer 16a.

The via 20 and the conductor wiring pattern 14b can be formed by sequentially subjecting the structure shown in FIG. 1(c) to electroless and electrolytic copper plating treatments in that order to form a plated layer (conductor layer) on the surface of the insulating layer 16a and on the side wall of the viahole 18, and then partially removing the conductor layer by etching except for the portions corresponding to the via 20 and the conductor wiring pattern 14b, respectively.

Figure 1E:
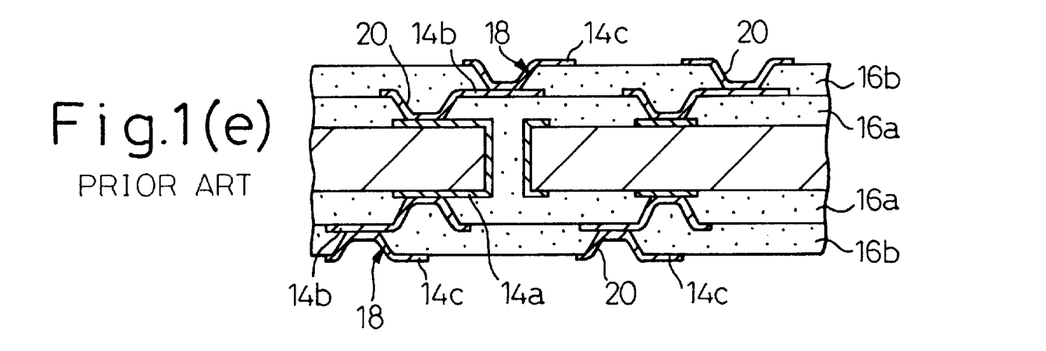

FIG. 1(e) shows a second insulating layer 16b which is formed on the first insulating layer 16a and has a via 20 extending therethrough and a conductor wiring pattern 14c formed thereon the via 20 electrically connecting the conductor wiring pattern 14c on the second insulating layer 16b to the conductor wiring pattern 14b on the first insulating layer 16a.

The second insulating layer 16b is formed by coating an insulating resin on the first insulating layer 16a. After forming a viahole 18 through the second insulating layer 16b, electroless and electrolytic copper plating treatments are sequentially carried out, in that order, to form a conductor layer lying over the surface of the second insulating layer 16b and the side wall and the bottom of the viahole 18. Thereafter, the conductor layer is partially removed by etching except for the portions corresponding to the via 20 and the conductor wiring pattern 14c.

The build-up process has been conventionally used to form multiple layers of conductor wiring patterns of a multilayer circuit board but has the following problems when used in producing semiconductor devices having a high density wiring for advanced integration.

A via 20 cannot be formed directly on another via 20, because vias 20 have the shape of a cup, formed of a plated metal coating on the side wall and the bottom of a viahole 18, with the core of the viahole 18 being left as a vacant space, on which a via 20 cannot be formed. The via 20 must be located at a shifted position with respect to a via 20 in the underlying insulating layer. Thus, positions of vias in the adjoining insulating layers must be shifted with respect to each other. This requirement for the shifted via positioning causes limitation to improvement in the wiring density.

Although the wiring density could be improved by reducing the diameter of the viahole 18, a reduced viahole diameter would prevent successful plating of the viahole and prevent completion of a via which would provide good electrical connection. This is because, during electrolytic plating, an electric field is concentrated at the orifice having a sharp corner and a thick deposition of a plated metal is formed around the orifice to prevent sufficient deposition on the inner surface of the viahole. FIG. 1(c) shows a viahole 18 tapered with an enlarged orifice to facilitate deposition on the inner surface of the viahole.

SUMMARY OF THE INVENTION

The object of the present invention is to solve the problems of the prior art and to provide a process of producing a multilayer circuit board which enables vias to be arranged at an improved density and ensures good electrical connection between conductor wiring patterns in the adjoining insulating layers.

To achieve the object according to the present invention, there is provided a process of producing a multilayer circuit board having multiple layers of conductor wiring patterns with insulating layers intervening therebetween, the insulating layers having vias extending therethrough to provide electrical connection between the conductor wiring patterns, the process comprising the steps of:

providing a circuit board having a conductor wiring pattern formed on one side thereof;

forming an insulating layer covering the conductor wiring pattern and said one side of the circuit board;

forming a viahole extending through the insulating layer to the conductor wiring pattern, the viahole having a bottom defined by an exposed portion of the conductor wiring pattern;

forming a recess in the insulating layer, the recess extending from an orifice of the viahole in the same pattern as another conductor wiring pattern which will be formed on the insulating layer;

forming a conductor layer covering the insulating layer and filling the viahole and the recess; and abrasive-working the plated metal layer until the insulating layer is exposed so that portions of the plated metal that fill the viahole and the recess remain unremoved and have top surfaces flush with a top surface of the insulating layer.

The viahole advantageously has a diameter increasing stepwise from the bottom to the orifice to ensure successful filling of the vias with a conductor metal.

The viahole and the recess are advantageously formed by irradiation of a laser beam onto the insulating layer to facilitate precise forming of the vias and the recesses.

The conductor layer typically consists of a plated metal.

DESCRIPTION OF THE PREFERRED EMBODIMENTS

FIGS. 2(a) to 2(e) show process steps according to a preferred embodiment of the present invention, in sectional views.

Figure 2A:
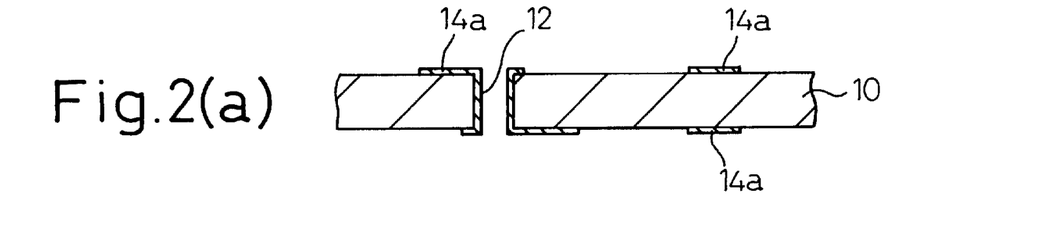
FIGS. 2(a) to 2(e) show a process of producing a multi-layer circuit board according to the present invention, in sectional views.

FIG. 2(a) shows a cross-section of a circuit board 10 made from an insulating resin board and having conductor wiring patterns 14a on both sides, respectively, and a throughhole 12 extending therethrough and electrically connecting the wiring patterns 14a.

The wiring patterns 14a can be formed by providing a resin board having copper foils bonded to both sides thereof, respectively, applying a photosensitive resist layer to the board, patterning the resist layer by exposure to light and development to form a resist pattern which conforms to a conductor wiring pattern 14a to be formed, and etching the copper foil using the resist pattern as a mask.

The throughhole 12 can be formed by boring the circuit board 10 by drilling, etc., to form a bore penetrating through the board 10, subjecting the board 10 sequentially to electroless land electrolytic plating treatments in that order to form a conductor layer on the side wall of the penetrating bore.

Figure 2B:
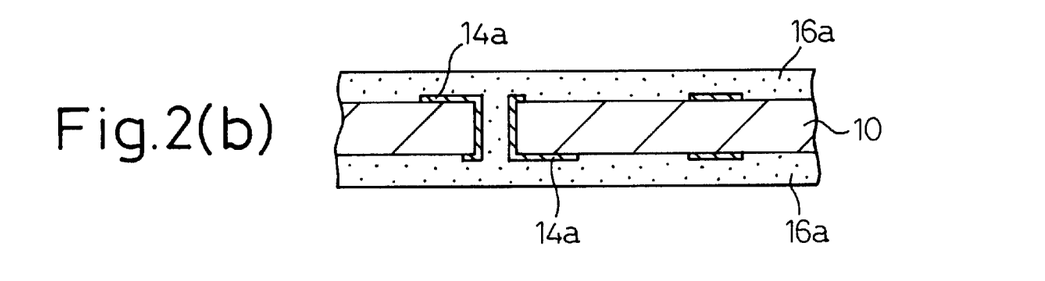

FIG. 2(b) shows a first insulating layer 16a formed by coating the board 10, on both sides, with an insulating resin such as polyimide or epoxy resin.

Figure 2C:
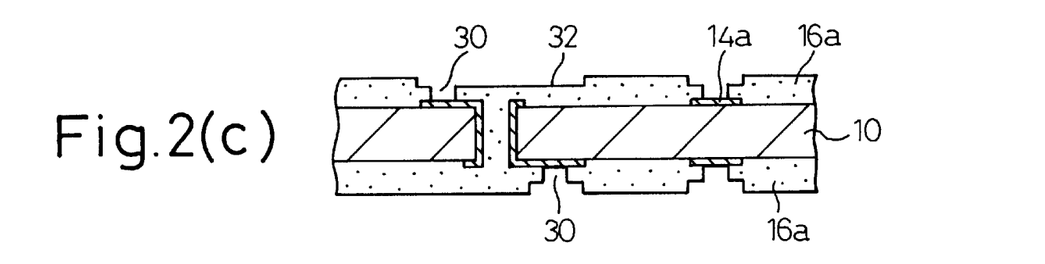

FIG. 2(c) shows viaholes 30 and recesses 32 both formed by irradiating a laser beam such as UV-YAG, $CO_2$ or EXIMA laser onto the insulating layer 16a. The recesses define a conductor wiring pattern to be formed on the insulating layer 16a.

The viaholes 30 and the recesses 32 may be formed either by first forming the viaholes 30 and then forming the recesses 32, or vice versa. The viaholes 30 extend through the insulating layer 16a to the wiring pattern 14a on the board 10 and can be formed by placing on the insulating layer 16a a mask having perforations at positions corresponding to that of the viaholes 30 and irradiating a laser beam to the insulating layer 16a through the perforations.

The recesses 32 have a depth corresponding to the thickness of a wiring pattern to be formed on the insulating layer 16a and are formed by engraving with a pattern corresponding to the wiring pattern, specifically by placing on the insulating layer 16a a mask having a perforated pattern corresponding to the wiring pattern and irradiating a laser beam to the insulating layer 16a which is thereby etched, or removed, to the above-mentioned depth.

The recesses may otherwise be formed by not using a perforated mask but by moving the laser beam spot over the insulating layer. 16a in a pattern corresponding to the wiring pattern.

The viaholes 30 are used for forming vias electrically connecting the wiring pattern 14a on the board 10 and another wiring pattern which will be formed on the insulating layer 16a, and therefore, the viaholes 30 are provided at positions at which both wiring patterns are electrically connected.

The viaholes 30 and the recesses 32 are filled with copper or other metal by plating to form conductors therein.

Viaholes 30, even if having a reduced diameter, can be filled with a plated metal without difficulty unless the viaholes 30 have too great a depth. For example, viaholes 30 having a diameter of about 50 $\mu$m and a depth of about 50 $\mu$m can be completely filled with a plated metal.

Figure 3A:
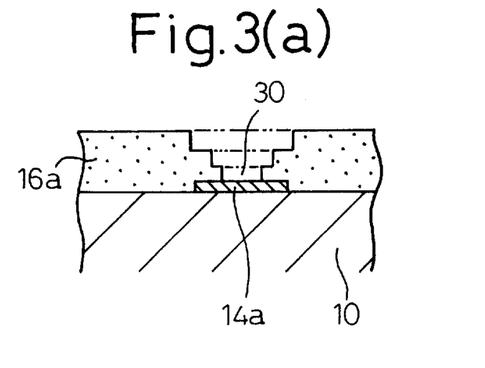
FIGS. 3(a) and 3(b) show viaholes having a stepped side wall according to a preferred embodiment of the present invention, in sectional views.
Figure 3B:
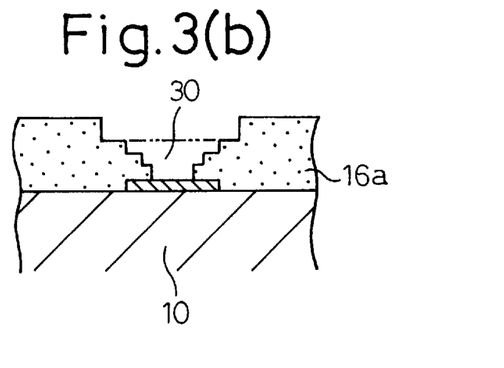

FIGS. 3(a) and 3(b) show viaholes 30 having a diameter increasing stepwise from the bottom to the orifice in (a) three steps and (b) four steps, respectively, in order to facilitate filling a plated metal in the viaholes 30. This form of viahole ensures a plated metal to deposit from the bottom to the orifice of the viahole 30, thereby entirely filling the whole volume of the viahole 30. In an alternative embodiment, the viahole 30 may be tapered with the diameter continuously increasing from the bottom to the orifice.

The viahole 30 having the stepwise increasing diameter is formed by circularly moving a laser beam spot first in a smallest radius corresponding to that of the bottom of the viahole 30 to form a bore extending through the insulating layer 16a to the wiring pattern 14a which defines the bottom of the viahole 30, then in an increased radius to form a first step, then in a further increased radius to form a second step, and so on.

Figure 4A:
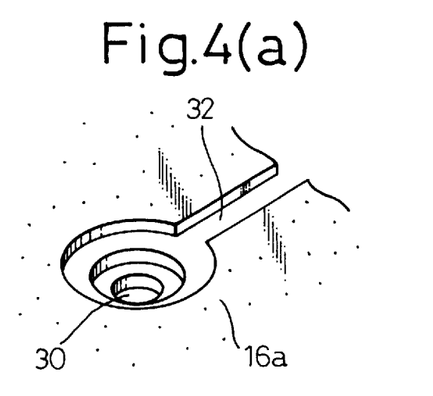
FIGS. 4(a) and 4(b) show stepped viaholes shown in FIGS. 3(a) and 3(b), respectively, with a recess extending therefrom, in enlarged perspective views.
Figure 4B:
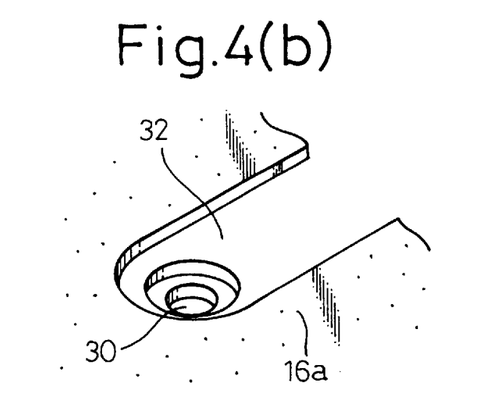

The recess 32 extends from the orifice of the viahole 30 and may have a width either smaller than, or the same as, the diameter of the orifice of the viahole 30, as shown in FIGS. 4(a) and 4(b), respectively.

The viahole 30 and the recess 32 may be formed by a method other than laser beam irradiation to the insulating layer 16a, for example, by ion milling, chemical etching, etc.

Figure 2D:
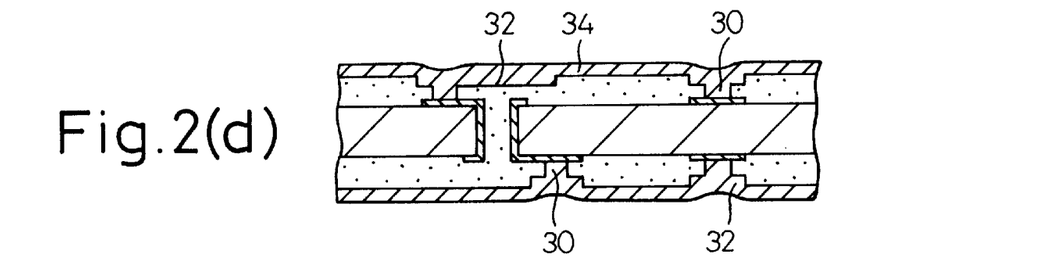

FIG. 2(d) shows a conductor layer 34 of a plated metal formed on the insulating layer 16a, on both sides of the circuit board 10 shown in FIG. 2(c), by sequential electroless and electrolytic copper plating treatments, the conductor layer covering the insulating layer 16a and filling the viaholes 30 and the recesses 32.

Figure 5A:
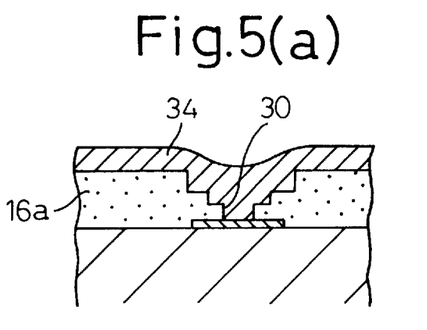
FIGS. 5(a) and 5(b) show stepped viaholes shown in FIGS. 3(a) and 3(b), respectively, filled with a plated metal, in sectional views.
Figure 5B:
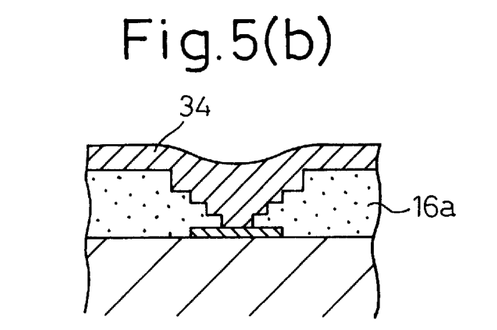

The electroless copper plating is used to provide a current supply layer on the inner surfaces of the viaholes 30 and the recesses 32 and on the insulating layer 16a and the electrolytic copper plating is then carried out using the current supply layer to form a thicker plated metal filling the viaholes 30 and the recesses 32 while covering the insulating layer 16a. FIGS. 5(a) and 5(b) show viaholes 30 having stepped side walls in three and four steps, respectively, and filled with a plated metal 34, which also covers the insulating layer 16a.

Figure 2E:
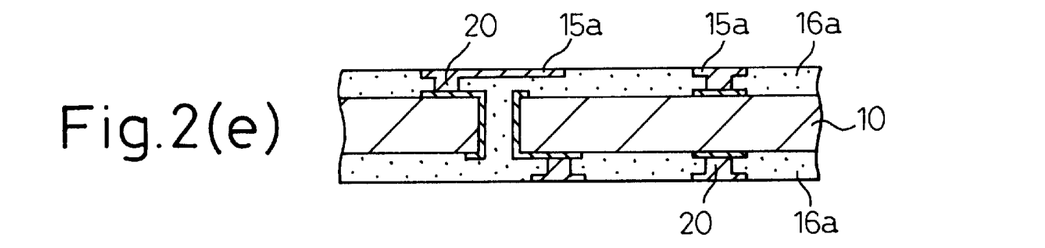

The plated metal layer 34 is then subjected to abrasive working such as chemical-mechanical etching until the insulating layer 16a is exposed while the plated metal 34 is partially left unremoved in the portion filling the viahole 30 and the recess 32 to form a via 20 and a conductor wiring pattern 15a, as shown in FIG. 2(e). The chemical-mechanical etching is typically carried out by buff polishing using abrasive agent together with etching solution to usually remove several to several tens of micrometers in depth.

The abrasive working is effected somewhat excessively so that the insulating layer 16a is removed in the top region in a small amount to avoid possible short circuit because of the plated metal 34 remaining on the insulating surface 16a.

The abrasive working provides the portions of the plated metal that fill the viahole 30 and the recess 32 have top surfaces flush with the top surface of the insulating layer 16a.

The thus-formed structure shown in FIG. 2(e) has a multilayer circuit, or a double layer circuit, in which the wiring pattern 14a on the circuit board 10 and the wiring pattern 15a on the insulating layer 16a are electrically connected through the via 20 formed by filling the viahole 30 with the plated metal 34.

To form a further conductive wiring layer, a second insulating layer 16b is formed on the first insulating layer 16a, followed by the same processing as described above, as shown in FIGS. 6(a) to 6(c).

Figures 6A, 6B, 6C:
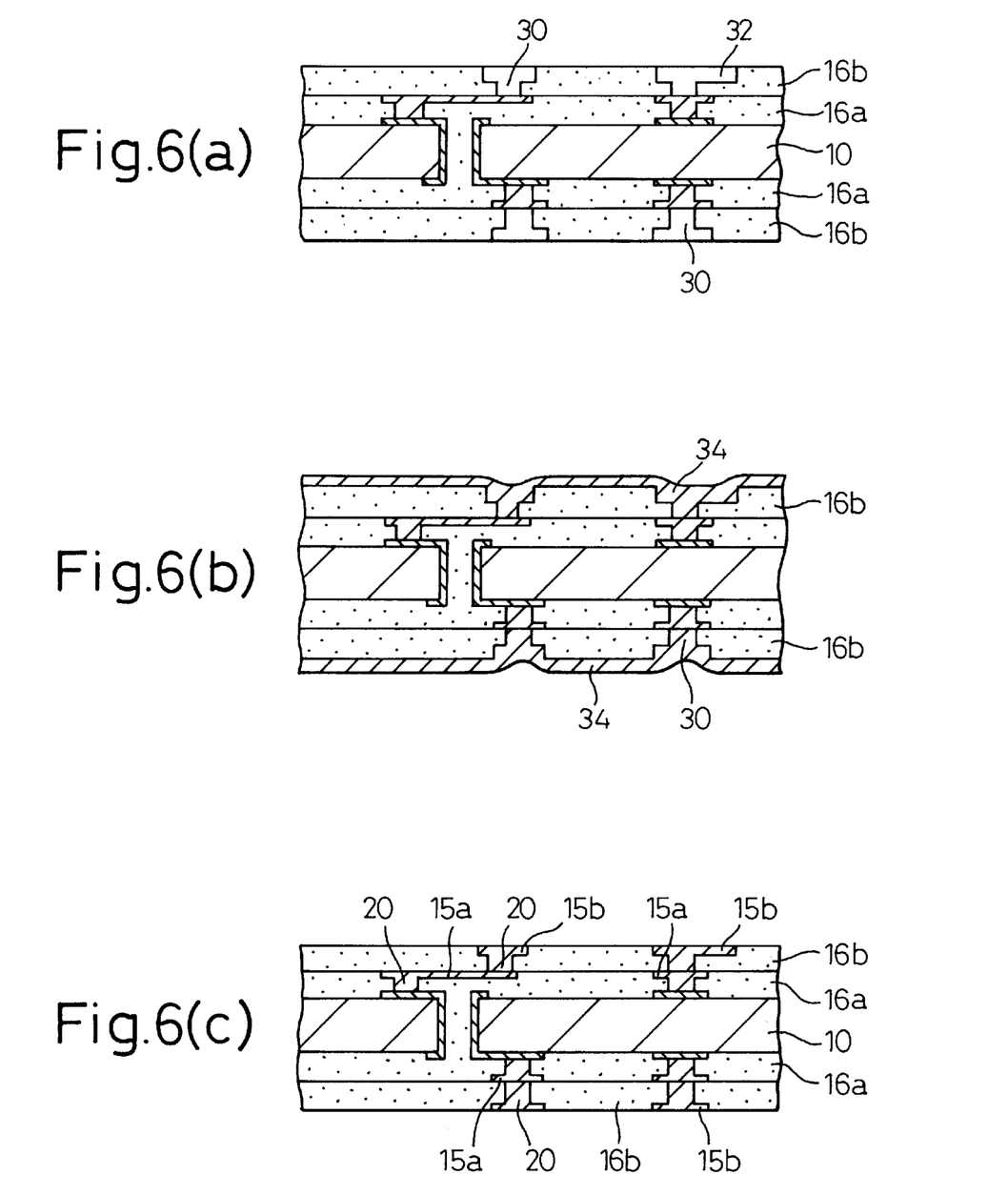
FIGS. 6(a) to 6(c) show a process of producing a triple layer circuit board according to the present invention, in sectional views.

Referring to FIG. 6(a), the second insulating layer 16b is subjected to laser beam irradiation to form viaholes 30 and recesses 32 in which a further wiring pattern will be formed. The viaholes 30 and the recesses 32 are formed in the second insulating layer 16b in the same manner as used in forming the viaholes 30 and the recesses 32 in the first insulating layer 16a. Specifically, the viaholes 30 are formed with stepped side wall with the diameter stepwise increasing from the bottom to the orifice as shown in FIG. 3(a) or 3(b) to facilitate filling of the viaholes 30 with sequential electroless and electrolytic copper plating treatments.

Referring to FIG. 6(b), sequential electroless and electrolytic copper plating treatments are carried out to form a plated metal layer 34 filling the viaholes 30 and the recesses 32 and covering the second insulating layer 16b.

Referring to FIG. 6(c), the plated metal layer 34 is then subjected to abrasive working until the second insulating layer 16b is exposed while the plated metal 34 is left partially unremoved in the portions filling the viaholes 30 and the recesses 32 to form vias 20 in the second insulating layer and wiring pattern 15b on the second insulating layer 16b in which the wiring pattern 15b on the second insulating layer 16b and the wiring pattern 15a on the first insulating layer 16a are electrically connected through the vias 20 formed by filling the viaholes 30 with the plated metal 34.

The thus-produced multilayer circuit board having a triple layer circuit in which the wiring pattern 14a on the circuit board 10, the wiring pattern 15a on the first insulating layer 16a and the wiring pattern 15b on the second insulating layer 16b are electrically connected through the vias 20.

A multilayer circuit board having more layers of wiring patterns may be produced by repeating the process steps described above.

In a further preferred embodiment of the present invention, the throughhole 12 extending through the circuit board 10 is filled with a conductive material to form a solid interconnection, so that a via can be formed directly on the solid interconnection to provide a further improved density in vias or wiring, as shown in FIGS. 7(a) to 7(f).

Figure 7A:
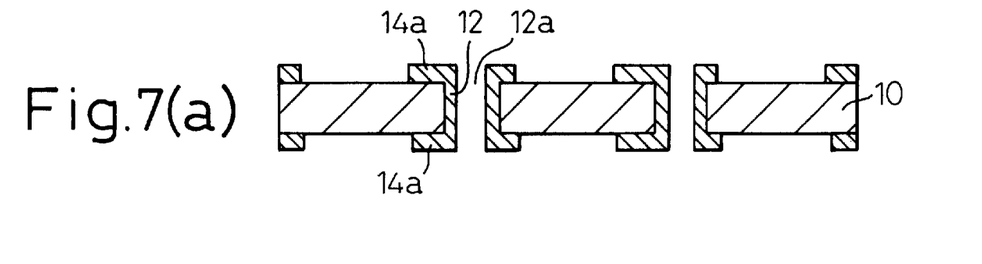
FIGS. 7(a) to 7(f) show a process of producing a multi-layer circuit board according to another preferred embodiment of the present invention, in sectional views.

FIG. 7(a) shows a circuit board 10 having substantially the same structure as shown in FIG. 2(a), in which throughholes 12 have a hollow core 12a and extend through the circuit, board 10 to electrically connect wiring patterns 14a on both side of the board 10.

Figure 7B:
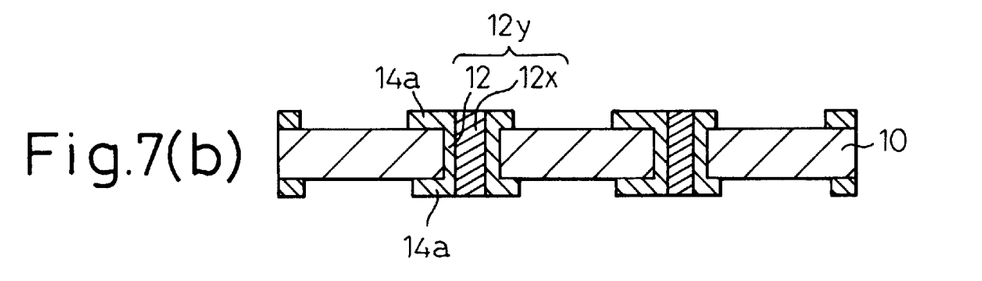

FIG. 7(b) shows the hollow cores 12a of the throughholes 12 that are filled with a conductive material 12x such as a conductive resin applied by screen printing or other suitable method in a conventional manner to form a solid interconnection 12y. The conductive material 12x advantageously consists of a conductive resin composed of epoxy or polyimide resin containing a silver filler or other conductive particles dispersed therein.

Figure 7C:
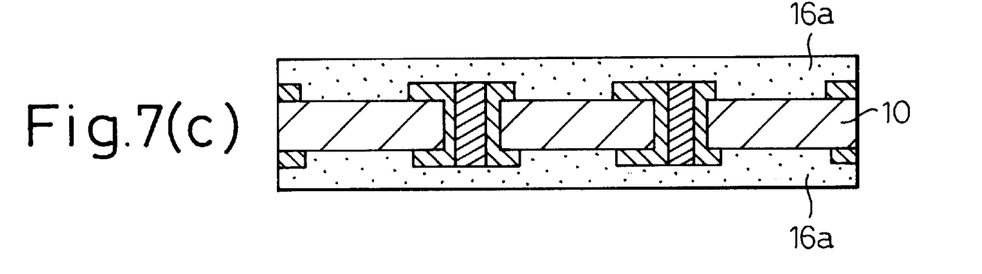
Figure 7D:
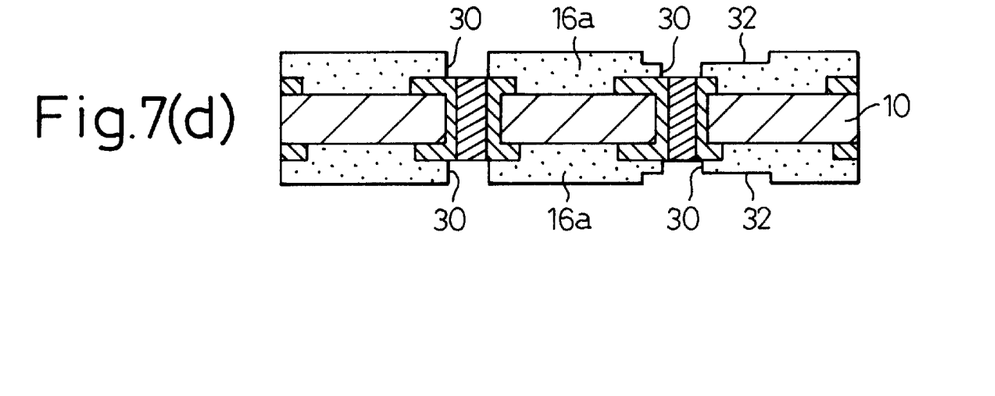
Figure 7E:
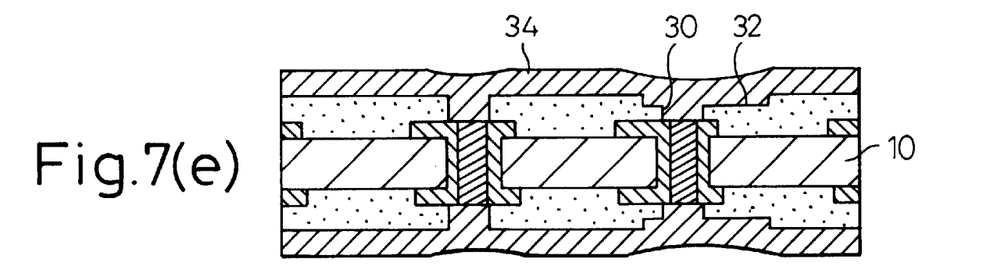
Figure 7F:
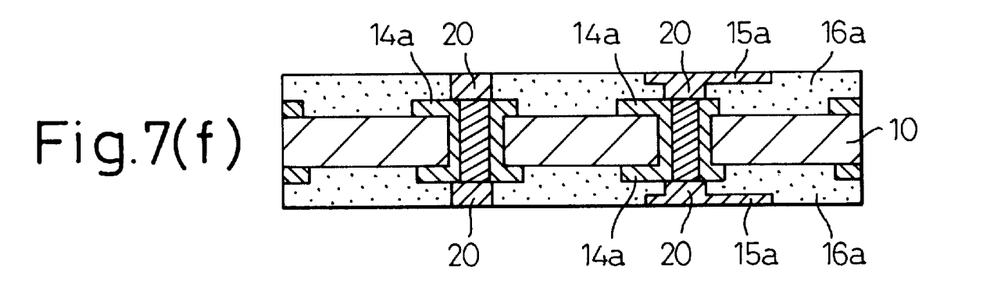

Then, in the same sequence as described referring to FIGS. 2(b) to 2(e), a first insulating layer 16a is formed on both sides of the board 10 (FIG. 7(c)), viaholes 30 and recesses 32 are formed in the first insulating layer 16a (FIG. 7(d)), a plated metal layer 34 is formed to cover the first insulating layer 16a while filling the viaholes 30 and the recesses 32 (FIG. 7(e)) and the plated metal layer 34 is then abrasive-worked to expose the first insulating layer 16a, the vias 20 and the wiring pattern 15a (FIG. 7(f)).

As shown in FIG. 7(f), the multilayer circuit structure has vias 20 formed directly on the solid interconnections 12y composed of the throughholes 12 with the core filled with the conductive material such as conductive resin 12x, so that limitation to the via positioning is further mitigated to enable a further improved density in wiring to be achieved.

The present inventive process of producing a multilayer circuit board includes abrasive working of a plated metal layer on an insulating layer, preferably also partially removing the insulating layer in the top portion, to provide an insulating layer having a flat top surface without unevenness thereby ensuring electrical connection between wiring patterns on the adjoining layers to advantageously provide an improved reliability of a semiconductor device.

Although the above-described embodiment relates to a multilayer circuit board having multiple layers of wiring patterns on both sides of a circuit board 10, a multilayer circuit board having multiple layers of wiring patterns on one side of a circuit board 10 may be also produced in the same manner as described above.

According to the present invention, viaholes 30 defining vias and recesses 32 defining a wiring pattern are filled with a plated metal to form conductors of vias and the wiring patterns to advantageously ensure electrical connection between wiring patterns on the adjoining insulating layers. Viaholes 30 and recesses 32 are simultaneously formed and plated to simultaneously provide vias and a wiring pattern, thereby providing an improved efficiency of production.

Viaholes 30 preferably have a diameter gradually increasing from the bottom to the orifice to facilitate complete filling of the viaholes with a plated metal, thereby ensuring electrical connection between wiring patterns on the adjoining insulating layers even when the viaholes have a reduced diameter to enable an improved density in wiring to be achieved.

Vias are formed by filling viaholes with a plated metal and can be located directly on or under each other to mitigate limitation to the via positioning, thereby enabling an improved density in wiring to be achieved.

The insulating layer 16 may be formed of a photosensitive resin such as photosensitive epoxy resin and the viaholes 30 and the recesses 32 may be formed by exposure to light and development.

The conductor layer 34 may be formed by a process including sputtering or vapor deposition to form a current supply layer composed of a lower chromium layer and an upper copper layer and forming an electrolytically plated copper layer on the current supply layer.

What is claimed is:

1. A process of producing a multilayer circuit board having multiple layers of conductor wiring patterns with insulating layers having vias extending therethrough to provide electrical connection between the conductor wiring patterns, the process comprising the steps of:

provi­ding a circuit board having a conductor wiring pattern formed on one side thereof;

forming an insulating layer covering the conductor wiring pattern and said one side of the circuit board;

forming a viahole extending through the insulating layer to the conductor wiring pattern, the viahole having a bottom defined by an exposed portion of the conductor wiring pattern;

forming a recess in the insulating layer, the recess extending from an orifice of the viahole in the same pattern as another conductor wiring pattern which will be formed on the insulating layer;

forming a conductor layer covering the insulating layer and filling the viahole and the recess; and abrasive-working the conductor layer until the insulating layer is exposed so that portions of the conductor layer that fill the viahole and the recess remain unremoved and form a via and a wiring pattern that have top surfaces flush with a top surface of the insulating layer.

2. A process according to claim 1, wherein the viahole has a diameter increasing stepwise from the bottom to the orifice.

3. A process according to claim 1 or 2, wherein the viahole and the recess are formed by irradiation of a laser beam to the insulating layer.

4. A process according to claim 1 or 2, wherein the conductor layer consists of a plated metal.

5. A process of producing a multilayer circuit board having multiple layers of conductor wiring patterns with insulating layers having vias extending therethrough to provide electrical connection between the conductor wiring patterns, the process consisting essentially of:

providing a circuit board having a conductor wiring pattern formed on one side thereof;

forming an in insulating layer covering the conductor wiring pattern and said one side of the circuit board;

forming a viahole extending through the insulating layer to the conductor wiring pattern, the viahole having a bottom defined by an exposed portion of the conductor wiring pattern;

forming a recess in the insulating layer, the recess extending from an orifice of the viahole in the same pattern as another conductor wiring pattern which will be formed on the insulating layer;

forming a conductor layer covering the insulating layer and filling the viahole and the recess; and abrasive-working the conductor layer until the insulating layer is exposed so that portions of the conductor layer that fill the viahole and the recess remain unremoved and form a via and a wiring pattern that have top surfaces flush with a top surface of the insulating layer.

6. The process of claim 5 wherein the viahole has a diameter that increases from the bottom to the surface.

7. The process of claim 5 wherein the viahole has a diameter that increases in a substantially stepwise manner from the bottom to the surface.

8. The process of claim 5 wherein the viahole and the recess are formed by irradiation of a laser beam.

9. The process of claim 5 wherein the conductor layer is formed by plating a metal.

10. The process of claim 9 further including the step of sputtering to form a chromium layer disposed in the recess before plating a metal.

11. The process of claim 10 further including the step of vapor deposition to form a chromium layer disposed in the recess before plating a metal.

12. The process of claim 5 wherein the circuit board has conductor wiring patterns formed on both sides thereof, wherein the process of claim 5 is performed on one or on both sides.

13. The process of claim 6 wherein the circuit board has conductor wiring patterns formed on both sides thereof, wherein the process of claim 5 is performed on one or on both sides.

14. The process of claim 7 wherein the circuit board has conductor wiring patterns formed on both sides thereof, wherein the process of claim 5 is performed on one or on both sides.

15. The process of claim 9 wherein the circuit board has conductor wiring patterns formed on both sides thereof, wherein the process of claim 5 is performed on one or on both sides.

16. The process of claim 5 wherein the abrasive-working of the conductor layer is continued until a top portion of the insulating layer is removed.

17. The process of claim 9 wherein the abrasive-working of the conductor layer is continued until a top portion of the insulating layer is removed.

* * * * *